(12) United States Patent
Zhao

(10) Patent No.: US 9,958,513 B2
(45) Date of Patent: May 1, 2018

(54) MAGNETIC SENSOR AND METHOD FOR QUANTITATIVELY IDENTIFYING MAGNETIC HYSTERESIS LOOP CHARACTERISTICS OF MAGNETIC CODE

(71) Applicant: GUANG ZHOU NALONG INTELLIGENCE TECHNOLOGY CO., LTD., Guangzhou, Guangdong (CN)

(72) Inventor: Zhangwu Zhao, Guangdong (CN)

(73) Assignee: Guang Zhou Nalong Intelligence Technology Co., Ltd., Guangzhou, Guangdong (CN)

(*) Notice: Subject to any disclaimer, the term of this patent is extended or adjusted under 35 U.S.C. 154(b) by 273 days.

(21) Appl. No.: 14/762,483

(22) PCT Filed: May 13, 2013

(86) PCT No.: PCT/CN2013/075530
§ 371 (c)(1),
(2) Date: Jul. 22, 2015

(87) PCT Pub. No.: WO2014/114037
PCT Pub. Date: Jul. 31, 2014

(65) Prior Publication Data
US 2015/0369883 A1    Dec. 24, 2015

(30) Foreign Application Priority Data

Jan. 23, 2013 (CN) .......................... 2013 1 0024736

(51) Int. Cl.
*G01R 33/12* (2006.01)
(52) U.S. Cl.
CPC .................. *G01R 33/123* (2013.01)
(58) Field of Classification Search
None
See application file for complete search history.

(56) References Cited

FOREIGN PATENT DOCUMENTS

CN    102147453 A  *  8/2011
CN    102722932 A  *  10/2012

OTHER PUBLICATIONS

Momose CN 102147453, "Magnetic sensor device" (English Machine Translation, herein after Momose, Published Aug. 10, 2011).*
Wei et al CN 102722932, "Magnetic head of currency detector" (English Machine Translation, Published Oct. 10, 2012).*

* cited by examiner

*Primary Examiner* — Melissa Koval
*Assistant Examiner* — Felicia Farrow
(74) *Attorney, Agent, or Firm* — Muncy, Geissler, Olds & Lowe, P.C.

(57) ABSTRACT

A magnetic sensor is provided with a magnet and a magnetic sensitive element, the magnetic sensitive element responses to a magnetic field generated by a magnetic code in a banknote which is magnetized by the magnet, the whole or part of a hysteretic loop process is completed when the magnetic code is magnetized by the magnet while passing by the surface of the magnetic sensor. A method for quantitatively identifying magnetic hysteresis loop characteristics of magnetic code, the whole or part of the hysteretic loop process is completed when the magnetic code is magnetized by the magnet while passing by the surface of the magnetic sensor, the magnetic sensor reads the signal of the corresponding magnetizing process, and then soft magnetism and hard magnetism properties of the magnetic code on the magnetic hysteresis loop characteristics of the magnetic code are identified.

6 Claims, 8 Drawing Sheets

| Magnetic code | Peak number | V1 | V0/V1 | V2/V1 | t50-t0 (ms) | t100-t90 (ms) | tw (ms) | Hc/Hm | SFD | SQ | Magnetism | Coercive force | Reversed width | Square |
|---|---|---|---|---|---|---|---|---|---|---|---|---|---|---|
| A | 2 | 3.9 | 0.00 | 0.31 | 1.25 | 0.50 | 2.10 | 0.5 | 1.2 | 0.5 | Soft magnetism | Medium | Medium | Small |
| B | 3 | 3.9 | 0.20 | 0.51 | 1.00 | 0.63 | 1.73 | 0.3 | 1.2 | 0.7 | Soft magnetism | Small | Medium | Big |
| C | 1 | 1.6 | 0 | 0 | – | 0.62 | 1.93 | 1 | – | 0.6 | Hard magnetism | Big | No reverse | Medium |

Fig. 9

MAGNETIC SENSOR AND METHOD FOR QUANTITATIVELY IDENTIFYING MAGNETIC HYSTERESIS LOOP CHARACTERISTICS OF MAGNETIC CODE

FIELD OF THE INVENTION

The present invention relates to the field of financial magnetism authentic identification technologies, and more particularly, to a magnetic sensor and a method for quantitatively identifying magnetic hysteresis loop characteristics of magnetic code.

BACKGROUND OF THE INVENTION

Currency is one of essential elements for a circulation market. In order to ensure the stabilization of financial circulation sequences, currency authenticity identification is required.

During the process of printing, a plurality of magnetic codes will be configured and distributed on the currency. Currency authenticity identification is just conducted through identifying the characteristics of these magnetic codes. In the prior art, there are two categories for detecting the characteristics of the magnetic code, i.e., magnetic detection and optical property detection.

Magnetic authentic identification has been widely applied to currency detection due to its advantages as convenient detection and rapid computer detection, and the like. At present, financial magnetic authentic identification has become one of indispensable ways for maintaining the stabilization of the financial circulation sequence.

The principle of the magnetic authentic identification is to detect a magnetic code set in the currency, including such characteristics as the strength and position distribution of a magnetic field and the like. With the progress of technology, the financial magnetic authentic identification technology has been developed into a relatively advanced Hall magnetoresistance from an induction coil which is over-sensitive to banknote detection speed and detection interval. However, the Hall magnetoresistance has an extremely low reluctivity in a weak magnetic field; moreover, its identification procedure depends on the signal intensity of the magnetic code; therefore, an extremely small detection gap is required, which is usually less than 0.1 mm. Therefore, signals are instable due to gap change and other factors that affect the signal intensity, which are easy to cause a series of problems like high seizing-up rate and high wear rate of banknotes and easy fracture of a banknote pressing wheel due to high pressure.

And as shown in FIG. 1, it is impossible for the Hall magnetoresistance to simply and easily distinguish soft magnetism and hard magnetism due to its symmetrical responses to magnetic field directions, and it is more impossible for the Hall magnetoresistance to identify the entire magnetic hysteresis loop characteristics. It can only judge according to the geometrical and mechanical properties of the magnetic code unilaterally and try to use the signal intensity modulus or ratio of signals of different magnetic code, which causes strong dependency on the factors that affect the signal intensity of the magnetic code and indeterminacy to the judgment of the signal intensity; therefore, it is incompetent to implement thorough anti-counterfeiting through completely identifying the magnetism characteristics of the magnetic code. Facts proved that the Hall magnetoresistance cannot identity new-edition counterfeit banknotes appeared in recent years.

Moreover, the Hall magnetoresistance prevailing the market at present cannot avoid superposition of adjacent signals with small intervals, which causes complication of an identification procedure.

Today when science and technology are highly developed at present, it is not difficult to forge the magnetic field and position distribution of a true magnetic code. In addition, the foregoing indeterminacy during judgment using the conventional technologies brings challenges to authentic identification on the magnetic code.

Therefore, it needs to provide an authentic identification technology that can identify more technical characteristics of the currency. But actually, it is really very difficult to completely forge all the magnetic hysteresis loop characteristics of a plurality of true magnetic codes unless knowing the magnetic code formulation and manufacturing process of the banknote printing factories. Therefore, complete authentic identification cannot simply depend on comparing the magnetic fields and position distribution of the magnetic code, but also needs to be capable of qualitatively and quantitatively identifying the soft and hard magnetism attributes of the magnetic code and the magnetic hysteresis loop characteristics, so as to ensure the stability for signal judgment and reduce the indeterminacy of the identification method.

Therefore, it is very necessary to provide a magnetic sensor and a method for quantitatively identifying magnetic hysteresis loop characteristics of magnetic code with respect to the defects of the prior art.

SUMMARY OF THE INVENTION

One object of the present invention is to provide a magnetic sensor for avoiding the defects of the prior art, wherein the magnetic sensor can completely distinguish characteristics of magnetic hysteresis loops respectively possessed by a plurality of magnetic codes set in a currency.

The foregoing object of the present invention is fulfilled using the following technical solution.

The invention provides a magnetic sensor which is provided with a magnet and a magnetic sensitive element, wherein the magnetic sensitive element responses to a magnetic field generated by a magnetic code in a banknote which is magnetized by the magnet, the whole or part of a hysteretic loop process is completed when the magnetic code is magnetized by the magnet while passing by the surface of the magnetic sensor, the magnetic sensor reads a signal of a corresponding magnetizing process, and then identification is conducted.

The foregoing magnet is configured to be elongated, the lateral width W of the magnet does not exceed two-thirds of a minimum interval gap of the magnetic code, the south and north poles of the magnet are vertical to the magnetic sensing direction of the magnetic sensor and the plane of the magnet sensor, and the intensity of a lateral magnetic field enables the magnetic code to undergo part or whole of a hysteretic loop process while passing by the magnetic sensor along a lateral direction.

The foregoing magnet is configured to be a permanent magnet, a direct current coil, an alternating current coil or an electromagnet.

The foregoing magnetic sensitive element consists of two or four magnetic sensitive units, the magnetic sensitive units have same specifications, but responses of the magnetic sensitive units are asymmetric to magnetic field directions; when the number of the magnetic sensitive elements is two, the two magnetic sensitive elements form a Wheatstone half-bridge circuit. When the number of the magnetic sensitive elements is four, the four magnetic sensitive elements form a Wheatstone full-bridge circuit.

The Wheatstone half-bridge circuit or the Wheatstone half-bridge circuit are symmetrically distributed at the two sides of a central line of the magnet along the magnetic sensing direction; the center to center interval d0 of the magnetic sensitive units forming the Wheatstone half-bridge circuit or the Wheatstone full-bridge circuit is less than or equal to the lateral width W of the magnet and the center to center interval does not exceed two-thirds of the minimum interval gap of the magnetic code.

The foregoing magnetic field responses of the magnetic sensitive units are not asymmetric or antisymmetric to the magnetic field direction, and the magnetic sensitive units arranged at one side of the central line of the magnet and the magnetic sensitive units at the other side have contrary or different responses to the same magnetic field direction.

The directions of the magnetic field direction detected by each magnetic sensitive unit and the magnetic code moving along the lateral direction of the magnet are same or contrary.

The foregoing magnetic sensitive unit is configured to be asymmetric or antisymmetric to the magnetic field direction in responses, including but not limited to an induction coil, a giant magnetoresistance, a tunneling magnetoresistance, or anisotropic magnetoresistance film or device having barber shop type conductive striation.

Another object of the present invention is to provide a method for quantitatively identifying magnetic hysteresis loop characteristics of magnetic code using the foregoing magnetic sensor for avoiding the defects of the prior art.

The foregoing object of the present invention is fulfilled using the following technical solution.

The present invention provides a method for quantitatively identifying magnetic hysteresis loop characteristics of magnetic code using the foregoing magnetic sensor, including the steps of: completing the whole or part of a hysteretic loop process while a magnetic code passes by the surface of the magnetic sensor, reading, by the magnetic sensor, a signal of a corresponding magnetizing process, and then identifying magnetic hysteresis loop characteristics of the magnetic code.

The foregoing identifying the magnetic hysteresis loop characteristics of the magnetic code includes identifying soft magnetism and hard magnetism properties of the magnetic code on the magnetic hysteresis loop characteristics of the magnetic code as well as quantitatively defining coercive force and square degree and reverse magnetic field distribution of the magnetic code.

The foregoing identifying the soft magnetism and hard magnetism properties specifically refers to judging whether the magnetic code is hard magnetism having a coercive force greater than the magnetic field of the magnet according to that whether a signal of a single magnetic code is one single-edge peak;

the quantitatively defining the coercive force of the magnetic code specifically refers to calculating a wave amplitude ratio between different wave peaks of the signal of each single magnetic code sensed by magnetic sensitive units so as to weigh and quantitatively define the coercive force of the magnetic code; and the quantitatively defining the square degree and the reverse magnetic field distribution characteristics of the magnetic hysteresis loop of the magnetic code specifically refers to calculating a ratio between time widths of a signal waveform of a single magnetic code sensed, and using the ratio to weigh and quantitatively define the square degree and the reverse magnetic field distribution of the magnetic hysteresis loop of the magnetic code.

A specific process for identifying the soft magnetic and hard magnetic properties of the magnetic code includes: when only one single-edge signal peak appears in the signal displayed by the single magnetic code, identifying whether the magnetic code is hard magnetism having a coercive force greater than the magnetic field of the magnet; otherwise, identifying the magnetic code as soft magnetic;

a specific process for identifying the coercive force of the magnetic code includes:

when two wave peaks appear, a ratio obtained via dividing the peak value of the latter peak by the peak value of the former peak reflects the forward coercive force of the magnetic code; when the ratio is 1, the corresponding coercive force of the magnetic code is zero; when the ratio is 0, only one peak exists at the moment, and the corresponding coercive force of the magnetic code is greater than the maximum lateral magnetic field of the magnet, so that the coercive force cannot be reversed by the magnetic field of the magnet. A wave amplitude ratio corresponding to the coercive force between the two is between 1 and 0; the wave amplitude ratio is more closer to 1 when the coercive force is smaller, and the wave amplitude ratio is more closer to 0 when the coercive force is larger;

when three wave peaks appear at the same time, a ratio obtained via dividing the peak value of the first peak by the peak value of the second peak reflects the negative coercive force of the magnetic code; the ratio is more closer to 0 when the coercive force is smaller, and the ratio is more closer to 1 when the coercive force is larger; and a ratio obtained via dividing the peak value of the third peak by the peak value of the second peak reflects the forward coercive force of the magnetic code; the wave amplitude ratio is more closer to 1 when the coercive force is smaller, and the wave amplitude ratio is more closer to 0 when the coercive force is larger; and a specific process for quantitatively defining the square degree and the reverse magnetic field distribution characteristics of the magnetic hysteresis loop of the magnetic code includes:

calculating the time width ratio of a waveform interval according to the signal displayed by each single magnetic code, wherein:

when only one signal peak exists, the magnetic code is hard magnetism that cannot be reversed by the magnet, and the reverse magnetic field distribution cannot be identified; while the square degree is then a ratio between a time difference when the peak falls back from a peak value to 90% of the peak value and the half-width of the peak; and when two or three signal peaks appear, a ratio between a time difference when a second peak from the last falls back from a peak value to 90% of the peak value and the half-peak width of the peak is the magnitude of the square degree; and similarly, a ratio between a time difference when the peak returns to zero from 50% of the peak value and the half-peak width of the peak is the reverse magnetic field distribution.

The magnetic sensor according to the present invention is provided with the magnet and the magnetic sensitive element, wherein the magnetic sensitive element responses to the magnetic field generated by the magnetic code in a banknote which is magnetized by the magnet, the whole or part of the hysteretic loop process is completed when the magnetic code is magnetized by the magnet while passing by the surface of the magnetic sensor, the magnetic sensor reads the signal of the corresponding magnetizing process, and then the identification is conducted. According to the method for quantitatively identifying magnetic hysteresis loop characteristics of magnetic code of the present invention, the whole or part of the hysteretic loop process is completed while the magnetic code passes by the surface of the magnetic sensor, the signal of the corresponding magnetizing process is read by the magnetic sensor, and then the magnetic hysteresis loop characteristics of the magnetic code are identified. The present invention can distinguish attributes of the magnetic code and can quantitatively define the magnetic hysteresis loop characteristics of the magnetic code, does not reply on the signal strength of the magnetic code, thus being not sensitive to detection gaps; therefore, the present invention has the characteristics of high identification precision and good identification stability.

BRIEF DESCRIPTION OF THE DRAWINGS

The present invention is further explained using the accompanying drawings, but the contents in the accompanying drawings will not con constitute to any limitation to the present invention.

FIG. 9 is a block diagram showing judgment and analysis conducted on the group of magnetic code signals as shown in FIG. 8.

DETAILED DESCRIPTION OF THE PREFERRED EMBODIMENTS

The present invention will be further explained in details with reference to the embodiments.

Embodiment 1

Figure 1:
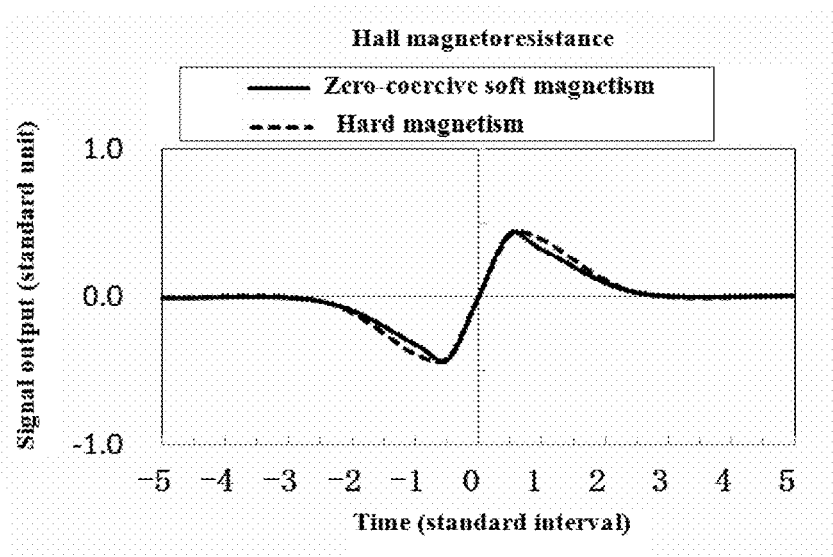
FIG. 1 is a block diagram of hard magnetism and soft magnetism signals read by a Hall magnetoresistance sensor having no distinction on magnetic field directions.
Figure 2:
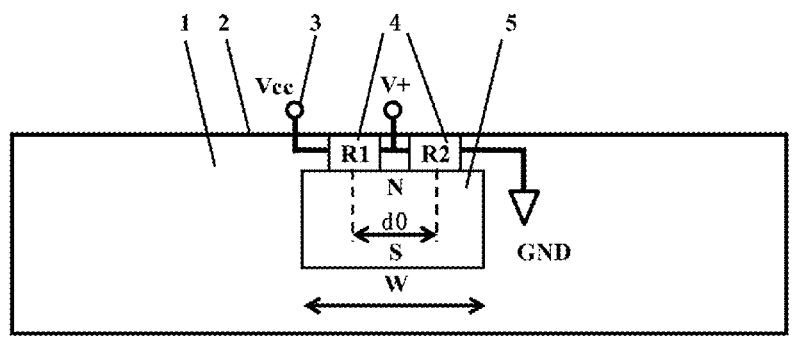
FIG. 2 is a structural block diagram of a first embodiment of a magnetic sensor according to the present invention.

A magnetic sensor, as shown in FIG. 2, is provided with a matrix 1, a housing 2, a Wheatstone bridge circuit interface 3, a magnetic sensitive element 4 and a magnet 5.

The matrix 1 is configured to carry other parts, and the matrix 1 is usually a plastic block or composed of other objects that constitute a mechanical strength. The magnetic sensitive element 4 responses to magnetic fields of a magnetic code on different directions generated when magnetizing the magnetic code by the magnet 5, the whole or part of a hysteretic loop process is completed when the magnetic code is magnetized by the magnet 5 while passing by the surface of the magnetic sensor, the magnetic sensor reads a signal of a corresponding magnetizing process, and then identification is conducted.

The magnet 5 is configured to be elongated, where the magnet 5 can be a single or a plurality of permanent magnets, direct current or alternating current coils, or other electromagnets.

The lateral width W of the magnet 5 does not exceed two-thirds of a minimum interval gap of the magnetic code. The minimum interval gap of the magnetic code is the public domain of the art, and the distance between two adjacent magnetic codes is the interval gap of the magnetic codes, wherein an interval gap having the minimum numerical value between two adjacent magnetic codes among all the interval gaps of the magnetic codes is the minimum interval gap of the magnetic code. The configuration of the lateral width of the magnet 5 is to avoid distortion or change of single magnetic code signal caused by the signal superposition of adjacent magnetic codes, so as to facilitate the identification of the signals and improve the signal detection accuracy.

Figure 3A:
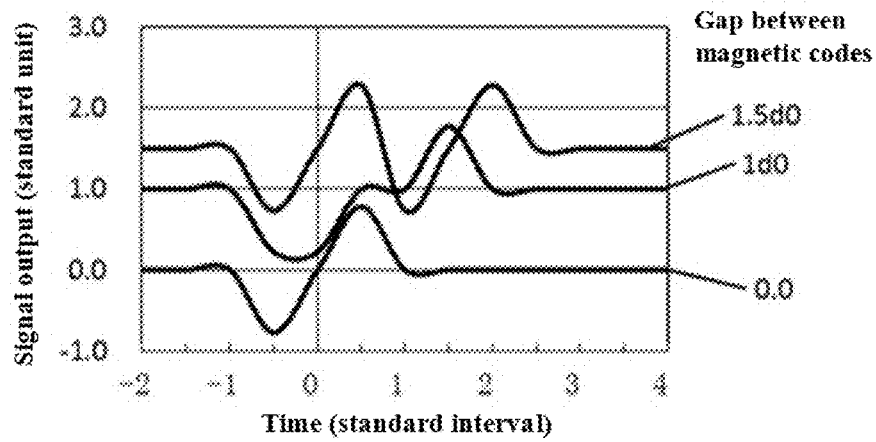
FIG. 3 is a block diagram showing influence of a lateral width of a magnet on signal superposition.
Figure 3B:
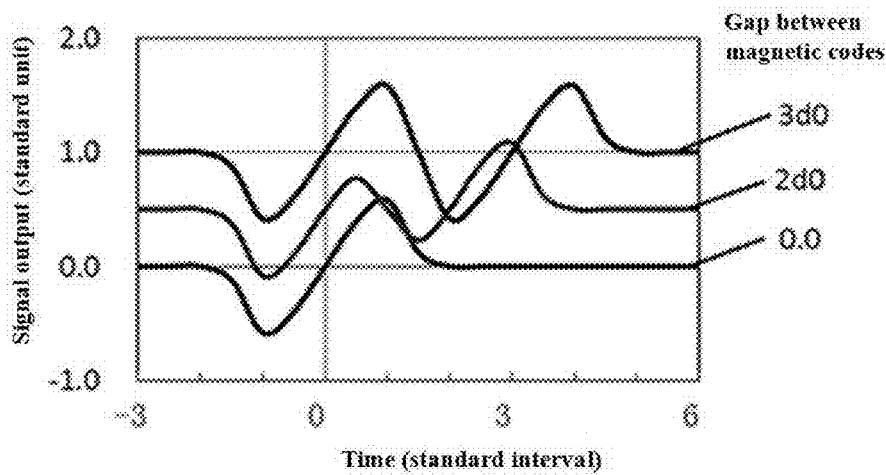

FIG. 3 shows the influence of the lateral width of the magnet 5 on the signal superposition. It can be seen from FIG. 3 that the signal superposition can be avoided only when the gap between two adjacent magnetic codes is at least greater than the width of the magnet by 1.5 times.

The south and north poles of the magnet 5 are vertical to the magnetic sensing direction of the magnetic sensor and the plane of the magnet sensor, and the intensity of a lateral magnetic field enables the magnetic code to undergo part or whole of a hysteretic loop process while passing by the magnetic sensor along a lateral direction.

The magnetic sensitive element is symmetrically distributed at the two sides of a central line of the magnet 5. The center to center interval of the magnetic sensitive element 4 is represented by a standard interval d0, wherein the standard interval d0 does not exceed the lateral width W of the magnet 5.

The magnetic sensitive element 4 consists of two magnetic sensitive units. The two magnetic sensitive units have same specifications, and the two magnetic sensitive elements form a Wheatstone half-bridge circuit. The two magnetic sensitive units are symmetrically distributed at the two sides of the central line of the magnet 5 along the magnetic sensing direction; the center to center interval of the magnetic sensitive units is less than or equal to the lateral width W of the magnet 5 and does not exceed two-thirds of the minimum interval gap of the magnetic code.

To be specific, the magnetic field responses of the magnetic sensitive units are asymmetric or antisymmetric to the magnetic field direction, and the magnetic sensitive units arranged at one side of the central line of the magnet 5 and the magnetic sensitive units at the other side have contrary or different responses to the same magnetic field direction.

The directions of the magnetic field direction detected by each magnetic sensitive unit and the magnetic code moving along the lateral direction of the magnet 5 are same or contrary.

The magnetic sensitive unit is configured to be an induction coil, a giant magnetoresistance, a tunneling magnetoresistance, or an anisotropic magnetoresistance film or device having barber shop type conductive striation. It should be noted that the magnetic sensitive units are not limited to the above forms, and may either be a fluxgate, a superconductor heterostructure and the like.

Wherein, the magnetic sensitive element 4 has different or contrary responses on magnetic fields in different directions, and may either be a magnetic induction coil, a giant magnetoresistance, a tunneling magnetoresistance, or an anisotropic magnetoresistance film chip or device having a barbershop lamp type conductive stripe.

The magnet 5 can be a single or a plurality of permanent magnets, direct current or alternating current coils or other electromagnets. The magnetic code is magnetized by the magnet 5 while passing by the surface of the magnetic sensor so as to complete the whole or part of a hysteretic loop process, and a signal of the magnetizing process is read by the magnetic sensor.

According to the magnetic sensor of the present invention, the magnetic code is magnetized by the magnet 5 while passing by the surface of the magnetic sensor so as to complete the whole or part of a hysteretic loop process, the signal of a corresponding magnetizing process is read by the magnetic sensor, and then the identification is conducted.

Through the magnetic sensor, the magnetic hysteresis loop characteristics of each magnetic code of a banknote can be read, so that the currency authentic identification is more thorough and more accurate.

The magnetic sensor provided by the present invention can effectively avoid the signal superposition of adjacent magnetic codes through decreasing the lateral width of the magnet and the standard interval to a value not exceeding two-thirds of the minimum magnetic code interval, thus being capable of solely analyzing single magnetic code signal, and bringing convenience for the identification process.

The magnetic sensor according to the present invention can distinguish whether a magnetic code belongs to soft magnetism or hard magnetism; the quantitatively defining the square degree and reverse magnetic field distribution characteristics of the magnetic hysteresis loop of the magnetic code and can quantitatively define the magnetic hysteresis loop characteristics, including coercive force, square degree and reverse magnetic field distribution and the gradient between each section of other magnetic hysteresis loops The judgment method of the magnetic sensor according to the present invention is specific to the magnetic hysteresis loop characteristics of each independent magnetic code, thus being not depending on the signal intensity of the magnetic code, and being capable of getting rid of the restraint of the magnetic field damping with the distance to a maximum extent. Therefore, a series of problems such as requiring of minimal detection gap, banknote seizing-up, roller wheel fracture, banknote wear, folding, angle and temperature drift are solved.

Due to the foregoing advantageous effects, the present invention can implement accurate identification, and can implement quantitative judgment standards on all the magnetic codes in the banknote, and can effectively check and prevent counterfeit banknotes.

Moreover, the magnetic sensor is simple in structure, is convenient to use, is not only suitable for identifying currency authenticity, but also is suitable for the authenticity identification of other articles such as cheque and the like.

Embodiment 2

A magnetic sensor has a structure which is same to/different from that of the first embodiment as follows: the magnetic sensitive element consists of four magnetic sensitive units. The four magnetic sensitive units have same specifications, and the four magnetic sensitive elements form a Wheatstone half-bridge circuit. The four magnetic sensitive units are symmetrically distributed at the two sides of the central line of the magnet along the magnetic sensing direction; the center to center interval of the magnetic sensitive units is less than or equal to the lateral width W of the magnet and does not exceed two-thirds of the minimum interval gap of the magnetic code.

Through the magnetic sensor, the magnetic hysteresis loop characteristics of each magnetic code of the currency can be read, so that the currency authentic identification is more accurate.

Embodiment 3

A method for quantitatively identifying magnetic hysteresis loop characteristics of magnetic code using the magnetic sensor according to the foregoing first or second embodiment, including the steps of: completing the whole or part of a hysteretic loop process while a magnetic code passes by the surface of the magnetic sensor, reading, by the magnetic sensor, a signal of a corresponding magnetizing process, and then identifying magnetic hysteresis loop characteristics of the magnetic code.

The identifying includes identifying soft magnetism and hard magnetism properties of the magnetic code on the magnetic hysteresis loop characteristics of the magnetic code as well as quantitatively defining coercive force, square degree and reverse magnetic field distribution of the magnetic code.

Wherein, the identifying the soft magnetism and hard magnetism properties of the magnetic code refers to judging whether the magnetic code is hard magnetism or soft magnetism according to that whether a signal of a single magnetic code is one single-edge peak. A wave peak quantity method specifically refers to judging according to the signal peak quantity displayed by each single magnetic code. When only one single-edge signal peak appears, it represents that the magnetic code is hard magnetism the magnetization direction of which cannot be reversed by the magnet; and the positive or negative wave peak represents that the magnetization direction of the magnetic code and the positive magnetic field direction sensed by the magnetic sensitive element firstly passing by are contrary or same; if a plurality of signal peaks appear, then the coercive force is judged to be soft magnetism having a coercive force less than the magnetic field of the magnet.

The quantitatively defining the coercive force of the magnetic code specifically refers to calculating a wave amplitude ratio between different wave peaks of the signal of each single magnetic code sensed by magnetic sensitive units so as to weigh and quantitatively define the coercive force of the magnetic code.

When two wave peaks appear, a ratio obtained via dividing the peak value of the latter peak by the peak value of the former peak reflects the forward coercive force of the magnetic code. When the ratio is 1, the corresponding coercive force of the magnetic code is zero; when the ratio is 0, only one peak exists at the moment, and the corresponding coercive force of the magnetic code cannot be reversed by the magnetic field of the magnet. A wave amplitude ratio corresponding to the coercive force between the two is between 1 and 0; the wave amplitude ratio is more closer to 1 when the coercive force is smaller, and the wave amplitude ratio is more closer to 0 when the coercive force is larger.

When three wave peaks appear at the same time, a ratio obtained via dividing the peak value of the first peak by the peak value of the second peak reflects the negative coercive force of the magnetic code; the ratio is more closer to 0 when the coercive force is smaller, and the ratio is more closer to 1 when the coercive force is larger. A ratio obtained via dividing the peak value of the third peak by the peak value of the second peak reflects the forward coercive force of the magnetic code; the wave amplitude ratio is more closer to 1 when the coercive force is smaller, and the wave amplitude ratio is more closer to 0 when the coercive force is larger.

The foregoing quantitatively defining the square degree and the reverse magnetic field distribution characteristics of the magnetic hysteresis loop of the magnetic code specifically refers to calculating a ratio between time widths of a signal waveform of a single magnetic code sensed, and using the ratio to weigh and quantitatively define the square degree and the reverse magnetic field distribution of the magnetic hysteresis loop of the magnetic code.

A time width ratio method of a waveform interval of a single magnetic code is employed to quantitatively identify the square degree (Sq=Mr/Ms) and the reverse magnetic field distribution (SFD =H/Hc) that represent the magnetic hysteresis loop characteristics wherein Mr is remanent magnetization, Ms is saturation magnetization, H is magnitude of field and Hc is coercivity.

The time width ratio of the waveform interval is still calculated according to the signal displayed by each single magnetic code.

When only one signal peak exists, the magnetic code is hard magnetism that cannot be reversed by the magnet, and the reverse magnetic field distribution cannot be identified. The square degree of the magnetic code can be weighed using a ratio between a time difference when the peak value falls back to 90% and when the peak value is 100%.

When two or three signal peaks appear, a ratio between a time difference when a second peak from the last falls back from a peak value to 90% of the peak value and a half-peak width represents the square degree, wherein the square degree is larger when the ratio is larger. While the reverse magnetic field distribution SFD can be represented by a ratio between a time difference when the second peak from the last returns to zero from 50% of the peak value and the half-peak width of the peak, wherein the SFD is larger when the ratio is smaller.

To be specific, following simplified formulas for quantitatively defining the magnetic hysteresis loop characteristics may be obtained wherein tw is the half-width time of the second peak from the last and SQO is the ratio of the wave amplitude of the second peak from the last to the half-peak width time of the peak when the square degree is 1.

$$Hc/Hm = 1 - (V2/V1)A(1/n) \quad (1)$$

$$SFD = 2(t0-t50)/tw \quad (2)$$

$$SQ/SQO = (t90-t100)/tw \quad (3)$$

Wherein, V2 is the peak value of a first peak from the last; V2 is the peak value of the first peak from the last; V1 is the peak value of the second peak from the last; n is an index of the magnetic field of the magnetic code damping with the distance, which is depending on the sensitivity of the magnetic sensitive element. Usually, n is between 1.0 and 3.5, wherein the value of n is smaller when the sensitivity is larger. SQ0 is the ratio between the wave amplitude of the second peak from the last and the half-peak width time of the peak when the square degree is 1; t100, t90, t50 and t0 are respectively the time when the peak values of the second peak from the last are 100%, return to 90%, 50% and zero; and tw is the half-width time of the second peak from the last.

According to the method for identifying provided by the present invention, whether the magnetic code belongs to hard magnetism is qualitatively judged according to the signal read and using the wave peak quantity of the same single magnetic code; the coercive force of the magnetic code is quantitatively identified using the wave amplitude ratio method of the same magnetic code; and the time width ratio method of the waveform interval of the single magnetic code is employed to quantitatively identify the square degree (Sq=Mr/Ms) and the reverse magnetic field distribution (SFD=H/Hc) that represent the magnetic hysteresis loop characteristics. The method according to the present invention does not depend on the signal modulus of the strength of magnetic field of the magnetic code, so as to be not sensitive to such factors affecting the signal intensity as the detection gap, banknote condition, banknote angle, temperature drift, magnetic sensitive element performance deviation and the like, and ensure the stability of the authentic identification judgment parameters and the judgment accuracy.

The present invention can distinguish whether the magnetic code belongs to soft magnetism or hard magnetism; and can quantitatively define the magnetic hysteresis loop characteristics, including such typical magnetic hysteresis loop characteristics as the coercive force, the square degree and the reverse magnetic field distribution. The judgment method of the magnetic sensor according to the present invention is specific to the magnetic hysteresis loop characteristics of each independent magnetic code, thus being not depending on the signal intensity of the magnetic code, and being capable of getting rid of the restraint of the magnetic field damping with the distance to a maximum extent. The invention has the characteristics of simple and convenient method operation, and accurate result.

Embodiment 4

The details of a magnetizing process for using the magnetic sensor of the present invention to magnetize the magnetic code when passing by above the magnet is as shown in FIG. 4. The magnetizing details depend on the soft magnetic and hard magnetic properties of the magnetic code and whether the magnetic code can be reversed by the magnetic field of the magnet.

Figure 4A:
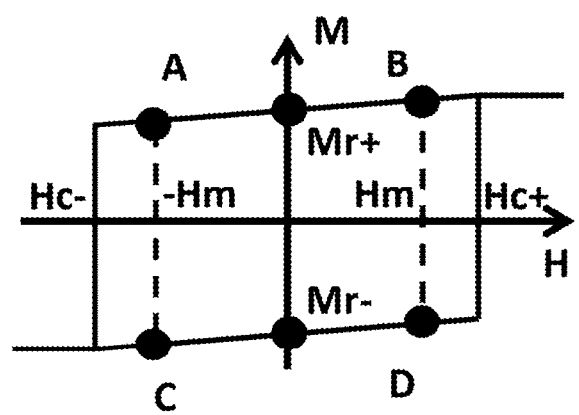
FIG. 4 is a block diagram of a magnetizing process path undergone by a hard magnetism or soft magnetism magnetic code while passing by the magnet along a lateral direction.
Figure 4B:
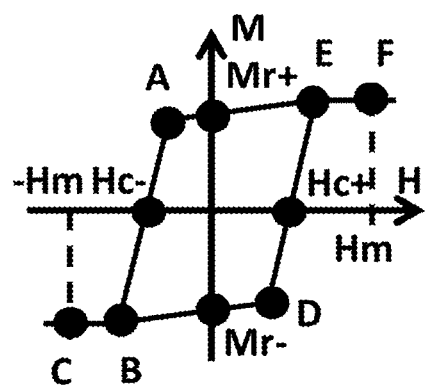

The hard magnetism magnetic code that cannot be reversed can only undergo a partial magnetic hysteresis loop magnetizing process, which is route 1 or route 2 as shown in FIG. 4*a*. In FIG. 4*a*, Hm is the maximum lateral magnetic field of the magnet, route 1 is from Mr+ to point A, then to Mr+, then to point B, and then to Mr+. The route 2 is from Mr− to point C, then to Mr−, then to point B, and then to Mr+. The soft magnetism magnetic code that can be reversed is determined by the magnetization direction (Mr+ or Mr−) of the residual magnetism when initiating from the magnetic code, which is route 1 or route 2 as shown in FIG. 4*b*. In FIG. 4*b*, route 1 is from Mr+ to point A, then to Hc−, and then to point B, point C, point B, Mr−, point D, Hc+, point E, point F, point E in sequence and finally to Mr+.

Route 2 is from Mr− to point B, then to point C, point B, Mr−, point D, Hc+, point E, point F, point E in sequence, and finally to Mr+.

Embodiment 5

Figure 5:
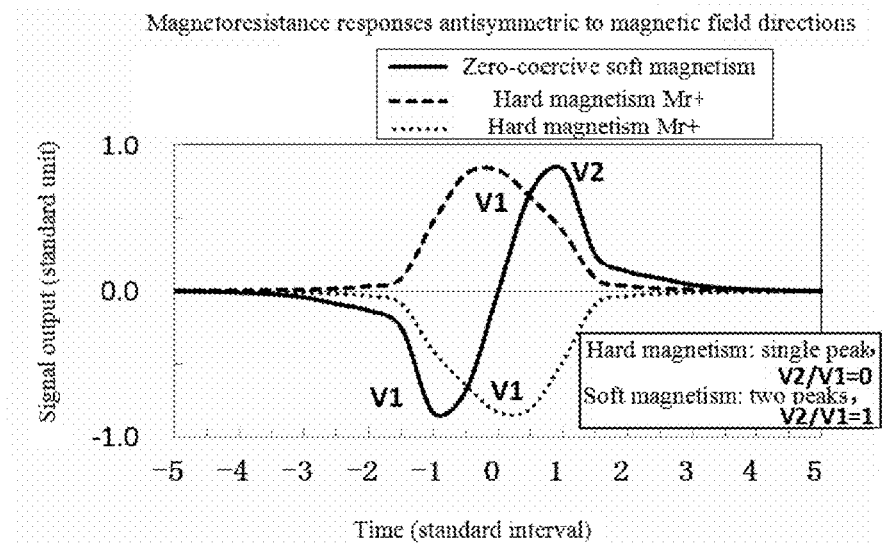
FIG. 5 is a block diagram showing a signal when a hard magnetism magnetic code having a coercive force that cannot be overcome by the magnet and a soft magnetism magnetic code having a coercive force which is zero pass by the magnetic sensor according to the first embodiment of the present invention from left to right.

FIG. 5 is a block diagram showing a signal when a hard magnetism magnetic code having a coercive force that cannot be overcome by the magnet and a soft magnetism magnetic code having a coercive force which is zero pass by the magnetic sensor according to the first embodiment of the present invention from left to right.

It can be seen from FIG. 5 that only one single-edge wave peak appears in the hard magnetism magnetic code, the signal direction depends on whether the direction of the residual magnetism of the magnetic code and the magnetic field direction of the magnet on the incoming direction of the magnetic code are the same or not, and a wave amplitude ratio is 0.

While two wave peaks are displayed for the soft magnetism magnetic code, and a wave amplitude ratio is 1. In this way, the wave peak may be used to accurately express any coercive force between zero and the magnetic field of the magnet.

Embodiment 6

Figure 6:
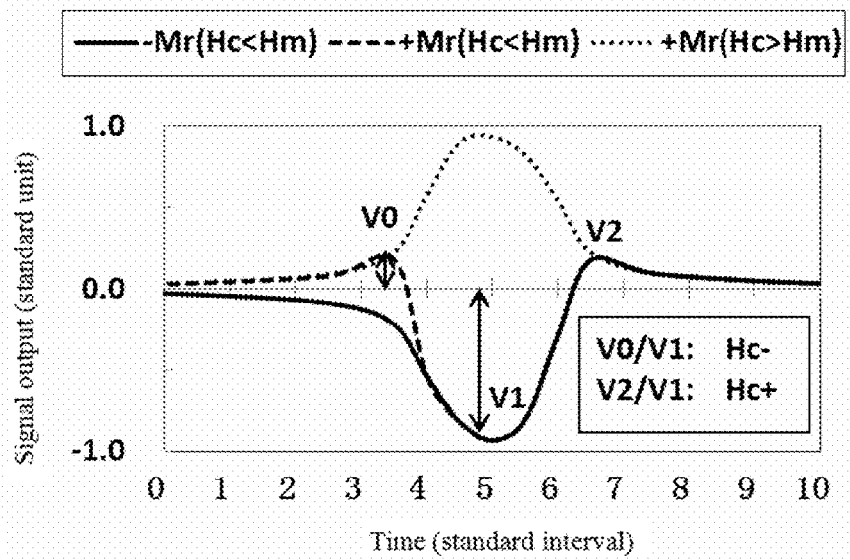
FIG. 6 is a block diagram showing a signal obtained by identifying a magnetic code through the magnetic sensor of the present invention.

The magnetic code is identified through the magnetic sensor of the present invention, wherein the signal obtained is as shown in FIG. 6.

It can be seen from FIG. 6 that one signal curve has two peaks and one signal curve has three peaks; therefore, it may be determined that the magnetic code is a soft magnetic code. The appearance of two peaks represents that the direction of the residual magnetism of the magnetic code and the magnetic field direction of the magnet on the incoming direction are the same; and the appearance of three peaks represents that the direction of the residual magnetism of the magnetic code and the magnetic field direction of the magnet on the incoming direction are contrary. The relevant coercive force is reflected through the corresponding wave amplitude ratio. According to formula (1), it can be derived that the coercive force $Hc=1-(V2/V1)^{(1/n)}$.

When the magnetic sensor of the present invention is used to identify the magnetic code, the specific characteristics of the magnetic hysteresis loop can be identified, and the anti-counterfeit accuracy can be improved.

Embodiment 7

Figure 7:
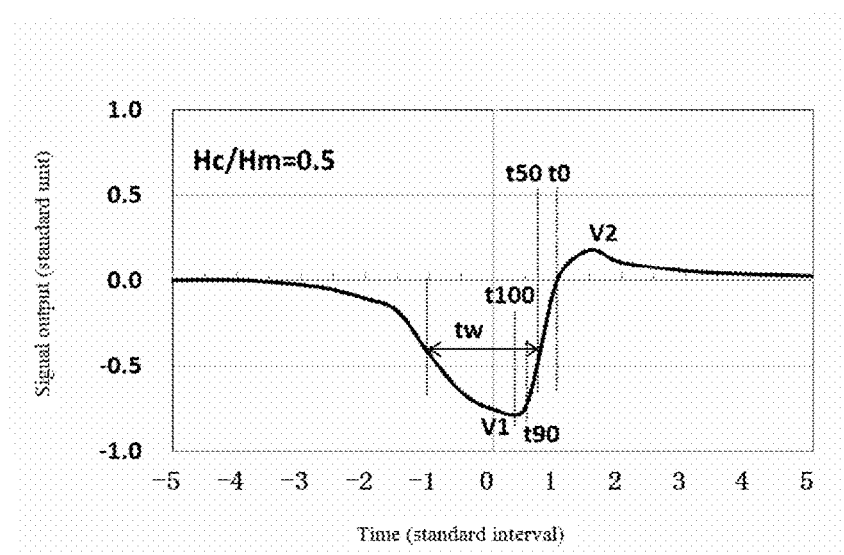
FIG. 7 is a block diagram showing a signal obtained by identifying a magnetic code through the magnetic sensor of the present invention.

The magnetic code is identified through the magnetic sensor of the present invention, wherein the signal obtained is as shown in FIG. 7. It can be seen from FIG. 7 that one signal curve has two peaks; therefore, it may be determined that the magnetic code is soft magnetism.

The coercive force can be quantized and obtained through a ratio between a second peak value and a first peak value.

The half-peak width of the first peak is set to be tw, the time at the peak value is t100, the time when the peak value falls back to 90% is t90, the time when the peak value falls back to 50% is t50, and the time when the peak value falls back to zero is 0.

The magnitude of the square degree is obtained via a ratio between the time difference from t90 to t100 and the half-peak width tw, wherein the square degree is better when the ratio is larger.

The reverse magnetic field distribution SFD is obtained via a ratio between the time difference from the return-to-zero time t0 to the half-peak width time t50 and the half-peak width, wherein the SFD is larger when the ratio is smaller. While the SFD is the description of gradient at a reverse point Hc. Therefore, the SFD is represented by dividing the interval between two corresponding peaks by the sum of the half-peak widths.

It is apparent that the magnetic hysteresis loop characteristics of single magnetic code may be obtained through the magnetic sensor and the method for quantitatively identifying magnetic hysteresis loop characteristics of magnetic code according to the present invention. The magnetic code in currency can be identified through the present invention, and the anti-counterfeit accuracy is improved.

Embodiment 8

Figure 8:
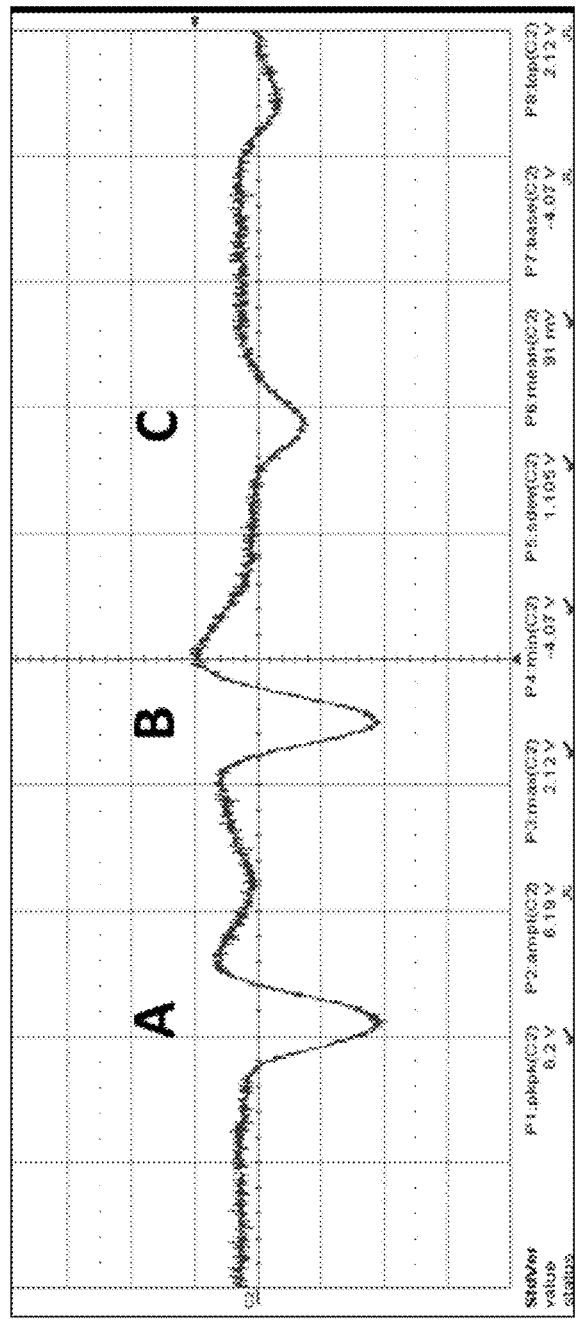
FIG. 8 is a block diagram showing a group of magnetic code signals obtained from a group of magnetic codes through passing by the magnetic sensor of the present invention.

FIG. 8 is a block diagram showing a group of signals obtained from a group of magnetic codes through passing by the magnetic sensor of the present invention. In FIG. 8, a magnetic code A and a magnetic code B look similar, and the signals thereof are stronger than that of a magnetic code C A table as shown in FIG. 9 shows demonstrative analysis on the signals as shown in FIG. 8 using the identification method provided by the present invention and an identification result is given. A judgment is obtained that the magnetic code B and the magnetic code A are not the same, and the magnetic code C which seems weak is hard magnetism actually. While this is an impossible task for the traditional Hall magnetoresistance magnetic code technology to complete.

Embodiment 9

Figure 10:
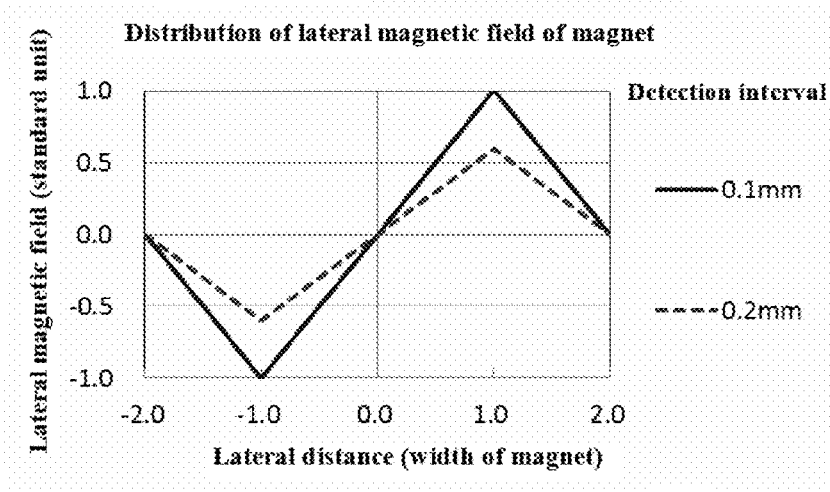
FIG. 10 is a block diagram showing change of the lateral magnetic field of the magnet used in the present invention with distances and detection gaps.

When the magnetic sensor and the method according to the present invention are used to identify the magnetic code, as shown in FIG. 10, the magnetic field of the magnet is weakened with the increasing of the detection gap, which results in the signal weakening and decreasing of relevant reverse distance. Therefore, it is necessary to equal order or other power correction. The equal order or other power correction is the public domain of the field, which will not be elaborated herein.

It should be noted that the magnetic sensor and the method for quantitatively identifying magnetic hysteresis loop characteristics of magnetic code according to the present invention are not only suitable for the field of financial technologies, but also suitable for other fields that need authentic identification, such as cheque, magnetic bar-code, article anti-counterfeit label, and the like.

It should be finally noted that the above embodiments are only configured to explain the technical solutions of the present invention, but are not intended to limit the protection scope of the present invention. Although detailed illustration is made to the present invention with reference to preferred embodiments, it may be understood by those having ordinary skills in the art that modification or equivalent replacement may be conducted on the technical solution of the present invention without departing from the essence and scope of the present invention.

What is claimed is:

1. A magnetic sensor, wherein:

the magnetic sensor is provided with a magnet and a magnetic sensitive element, the magnetic sensitive element responds to a magnetic field generated by a magnetic code in a banknote which is magnetized by the magnet, the whole or part of a hysteretic loop process is completed when the magnetic code is magnetized by the magnet while passing by the surface of the magnetic sensor, the magnetic sensor quantitatively identifies magnetic hysteresis loop characteristics of the magnetic code, and the magnet is configured to be elongated, the lateral width W of the magnet does not exceed two-thirds of a minimum interval gap of the magnetic code, the south and north poles of the magnet are vertical to the magnetic sensing direction of the magnetic sensor and the plane of the magnet sensor, and the intensity of a lateral magnetic field enables the magnetic code to undergo part or whole of a hysteretic loop process while passing by the magnetic sensor along a lateral direction.

2. The magnetic sensor according to claim 1, wherein: the magnet is configured to be a permanent magnet, a direct current coil, an alternating current coil or an electromagnet.

3. The magnetic sensor according to claim 1, wherein: the magnetic sensitive element consists of two or four magnetic sensitive units, the magnetic sensitive units have same specifications, but responses of the magnetic sensitive units are asymmetric to magnetic field directions; when the number of the magnetic sensitive elements is two, the two magnetic sensitive elements form a Wheatstone half-bridge circuit; and when the number of the magnetic sensitive elements is four, the four magnetic sensitive elements form a Wheatstone full-bridge circuit; and the Wheatstone half-bridge circuit or the Wheatstone half-bridge circuit is symmetrically distributed at the two sides of a central line of the magnet along the magnetic sensing direction;

the center to center interval dO of the magnetic sensitive units forming the Wheatstone half-bridge circuit or the Wheatstone full-bridge circuit is less than or equal to the lateral width W of the magnet and the center to center interval does not exceed two-thirds of the minimum interval gap of the magnetic code.

4. The magnetic sensor according to claim 3, wherein: the magnetic field responses of the magnetic sensitive units are asymmetric or antisymmetric to the magnetic field direction, and the magnetic sensitive units arranged at one side of the central line of the magnet and the magnetic sensitive units at the other side have contrary or different responses to the same magnetic field direction; and the directions of the magnetic field direction detected by each magnetic sensitive unit and the magnetic code moving along the lateral direction of the magnet are same or contrary.

5. The magnetic sensor according to claim 4, wherein: the magnetic sensitive unit is configured to be an induction coil, a gaint magnetoresistance, a tunneling magnetoresistance, an anisotropic magnetoresistance film or device having barber shop type conductive striation, a fluxgate or a superconductor heterostructure.

6. A method for quantitatively identifying magnetic hysteresis loop characteristics of magnetic code using magnetic sensor, comprising the steps of: completing the whole or part of a hysteretic loop process while a magnetic code passes by the surface of the magnetic sensor, identifying magnetic hysteresis loop characteristics of the magnetic code, wherein:

the identifying the magnetic hysteresis loop characteristics of the magnetic code comprises identifying soft magnetism and hard magnetism properties of the magnetic code on the magnetic hysteresis loop characteristics of the magnetic;

code as well as quantitatively defining coercive force, square degree and reverse magnetic field distribution of the magnetic code;

the identifying the soft magnetism and hard magnetism properties specifically refers to judging whether the magnetic code is hard magnetism having a coercive force greater than the magnetic field of the magnet according to that whether a signal of a single magnetic code is one single-edge peak;

the quantitatively defining the coercive force of the magnetic code specifically refers to calculating a wave amplitude ratio between different wave peaks of the signal of each single magnetic code sensed by magnetic sensitive units so as to weigh and quantitatively define the coercive force of the magnetic code;

the quantitatively defining the square degree and the reverse magnetic field distribution characteristics of the magnetic hysteresis loop of the magnetic code specifically refers to calculating a ratio between time widths of a signal waveform of a single magnetic code sensed, and using the ratio to weigh and quantitatively define the square degree of the magnetic hysteresis loop of the magnetic code and the reverse magnetic field distribution;

a specific process for identifying the soft magnetic and hard magnetic properties of the magnetic code comprises: when only one single-edge signal peak appears in the signal displayed by the single magnetic code, identifying whether the magnetic code is hard magnetism having a coercive force greater than the magnetic field of the magnet; otherwise, identifying the magnetic code as soft magnetic;

a specific process for identifying the coercive force of the magnetic code comprises:

when two wave peaks appear, a ratio obtained via dividing the peak value of the latter peak by the peak value of the former peak reflects the forward coercive force of the magnetic code; when the ratio is 1, the corresponding coercive force of the magnetic code is zero; when the ratio is 0, only one peak exists at the moment, and the corresponding coercive force of the magnetic code is greater than the maximum lateral magnetic field of the magnet, so that the coercive force cannot be reversed by the magnetic field of the magnet; a wave amplitude ratio corresponding to the coercive force between the two is between 1 and 0; the wave amplitude ratio is more closer to 1 when the coercive force is smaller, and the wave amplitude ratio is more closer to 0 when the coercive force is larger;

when three wave peaks appear at the same time, a ratio obtained via dividing the peak value of the first peak by the peak value of the second peak reflects the negative coercive force of the magnetic code; the ratio is more closer to 0 when the coercive force is smaller, and the ratio is more closer to 1 when the coercive force is larger; and a ratio obtained via dividing the peak value of the third peak by the peak value of the second peak reflects the forward coercive force of the magnetic code; the wave amplitude ratio is more closer to 1 when the coercive force is smaller, and the wave amplitude ratio is more closer to 0 when the coercive force is larger; and a specific process for quantitatively defining the square degree and the reverse magnetic field distribution characteristics of the magnetic hysteresis loop of the magnetic code comprises: calculating the time width ratio of a waveform interval according to the signal displayed by each single magnetic code, wherein:

when only one signal peak exists, the magnetic code is hard magnetism that cannot be reversed by the magnet, and the reverse magnetic field distribution cannot be identified; the square degree of the magnetic code is quantitatively expressed by a ratio between a time difference when the peak falls back from a peak value to 90% of the peak value and the half-width of the peak; and when two or three signal peaks appear, a ratio between a time difference when a second peak from the last falls back from a peak value to 90% of the peak value and the half-peak width of the peak is the magnitude of the square degree; and a ratio between a time difference when the peak returns to zero from 50% of the peak value and the half-peak width of the peak is the reverse magnetic field distribution.

* * * * *